(12) United States Patent
Usui et al.

(10) Patent No.: US 11,453,028 B2
(45) Date of Patent: Sep. 27, 2022

(54) VIBRATION DEVICE

(71) Applicant: Murata Manufacturing Co., Ltd., Nagaokakyo (JP)

(72) Inventors: Kentaro Usui, Nagaokakyo (JP); Junichi Hashimoto, Nagaokakyo (JP); Yuhei Yamagishi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 768 days.

(21) Appl. No.: 16/395,686

(22) Filed: Apr. 26, 2019

(65) Prior Publication Data
US 2019/0247886 A1 Aug. 15, 2019

Related U.S. Application Data

(63) Continuation of application No. PCT/JP2017/039873, filed on Nov. 6, 2017.

(30) Foreign Application Priority Data

Nov. 11, 2016 (JP) .............................. JP2016-220156

(51) Int. Cl.
*B06B 1/06* (2006.01)
*H01L 41/09* (2006.01)
(Continued)

(52) U.S. Cl.
CPC ............. *B06B 1/0603* (2013.01); *B06B 1/06* (2013.01); *H01L 41/0805* (2013.01); *H01L 41/0973* (2013.01); *G06F 3/016* (2013.01)

(58) Field of Classification Search
CPC ............... B06B 1/0603; H01L 41/0805; H01L 41/0973
See application file for complete search history.

(56) References Cited

U.S. PATENT DOCUMENTS

| | | | | |
|---|---|---|---|---|
| 2003/0011283 A1* | 1/2003 | Takeuchi | ............... | G01H 11/08 310/328 |
| 2005/0016277 A1* | 1/2005 | Takeuchi | ................. | B06B 1/06 73/580 |

(Continued)

FOREIGN PATENT DOCUMENTS

| | | |
|---|---|---|
| WO | 2012061495 A1 | 5/2012 |
| WO | 2012157691 A1 | 11/2012 |

(Continued)

OTHER PUBLICATIONS

English Translation of WO 2016027667, 2013.*

(Continued)

*Primary Examiner* — Bryan P Gordon
(74) *Attorney, Agent, or Firm* — ArentFox Schiff LLP

(57) ABSTRACT

The vibration device includes a diaphragm, and a plurality of piezoelectric films that are arranged at predetermined intervals in a first direction of the diaphragm to face the diaphragm and extend parallel to a second direction orthogonal to the first direction. The diaphragm has at least one slit formed therein and dividing the diaphragm into respective regions. Each of the piezoelectric films are fixed to a respective region of the diaphragm while extending along the second direction in a tensioned state. The piezoelectric films expand and contract in a plane direction when a voltage is applied thereto.

17 Claims, 5 Drawing Sheets

(51) Int. Cl.
    *H01L 41/08*     (2006.01)
    *G06F 3/01*     (2006.01)

(56) References Cited

U.S. PATENT DOCUMENTS

| | | |
|---|---|---|
| 2012/0104901 A1 | 5/2012 | Jiang et al. |
| 2014/0079255 A1 | 3/2014 | Ando |
| 2016/0209926 A1* | 7/2016 | Hashimoto .............. H04R 7/00 |
| 2017/0083099 A1* | 3/2017 | Hashimoto ........... H01L 41/081 |

FOREIGN PATENT DOCUMENTS

| | | |
|---|---|---|
| WO | 2015053247 A1 | 4/2015 |
| WO | 2015190358 A1 | 12/2015 |
| WO | 2016027667 A1 | 2/2016 |

OTHER PUBLICATIONS

International Search Report issued for PCT/JP2017/039873, dated Jan. 23, 2018.
Written Opinion of the International Searching Authority issued for PCT/JP2017/039873, dated Jan. 23, 2018.

* cited by examiner

VIBRATION DEVICE

CROSS REFERENCE TO RELATED APPLICATIONS

The present application is a continuation of International application No. PCT/JP2017/039873, filed Nov. 6, 2017, which claims priority to Japanese Patent Application No. 2016-220156, filed Nov. 11, 2016, the entire contents of each of which are incorporated herein by reference.

TECHNICAL FIELD

One embodiment according to the present invention relates to a vibration device that generates vibration.

BACKGROUND OF THE INVENTION

In recent years, tactile sense presentation devices have been proposed that transmit vibration when a user touches a key on a touch panel keyboard or the like to give the user tactile feedback, which causes the user to feel that the key is "pushed".

For example, in PCT International Publication No. 2015/053247 (Patent Document 1), a tactile sense presentation device including a diaphragm and a piezoelectric film has been proposed. The piezoelectric film is connected in a state that allows stress to be generated in the diaphragm. The piezoelectric film expands and contracts in a plane direction when a voltage is applied. When the piezoelectric film expands and contracts, the diaphragm vibrates in a normal direction.

In a conventional tactile sense presentation device, resonance with the diaphragm is used to increase a displacement amount. The resonance characteristic of the device is influenced by the outer dimensions of the diaphragm, and the outer dimensions are often determined by the application of the tactile sense presentation device. This makes the degree of freedom in designing the resonance characteristic low. Further, the resonance characteristic is strongly influenced by a long-side direction of the diaphragm. Therefore, attempting to determine the resonance characteristic based on a short-side direction of the diaphragm causes a problem that the resonance characteristic derived from the long-side direction is developed under strong influence from the long-side direction to decrease the displacement amount.

Accordingly, an object of one embodiment according to the present invention is to provide a vibration device that has a high degree of freedom in designing a resonance characteristic and suppresses a decrease in displacement amount.

BRIEF SUMMARY OF THE INVENTION

A vibration device according to one embodiment of the present invention includes a diaphragm, and a plurality of piezoelectric films that are arranged at predetermined intervals in a first direction of the diaphragm to face the diaphragm and extend parallel to a second direction orthogonal to the first direction, in which the diaphragm has at least one slit, and the piezoelectric films are fixed to the diaphragm while extending along the second direction in a tensioned state and expand and contract in a plane direction when a voltage is applied.

The diaphragm has the slit so as to divide the diaphragm into a plurality of regions. The piezoelectric films arranged to face the diaphragm are strongly influenced by a size of each of the regions that result from dividing the diaphragm the piezoelectric films face. Further, a resonance characteristic is strongly influenced by a long-side direction (i.e., the longer dimension); thus, when the diaphragm is divided by the slit, a length in the first direction of each of the regions that result from dividing the diaphragm becomes short, thereby reducing the influence on the resonance characteristic. Therefore, the resonance characteristic of each of the piezoelectric films extending along the second direction in a tensioned state is easily maintained and is less susceptible to the influence of the first direction of the diaphragm, thereby suppressing a decrease in displacement amount due to the influence of the first direction of the diaphragm.

One embodiment of the present invention makes it possible to increase a degree of freedom in designing the resonance characteristic and suppress a decrease in displacement amount.

DESCRIPTION OF THE PREFERRED EMBODIMENTS

Figure 1:
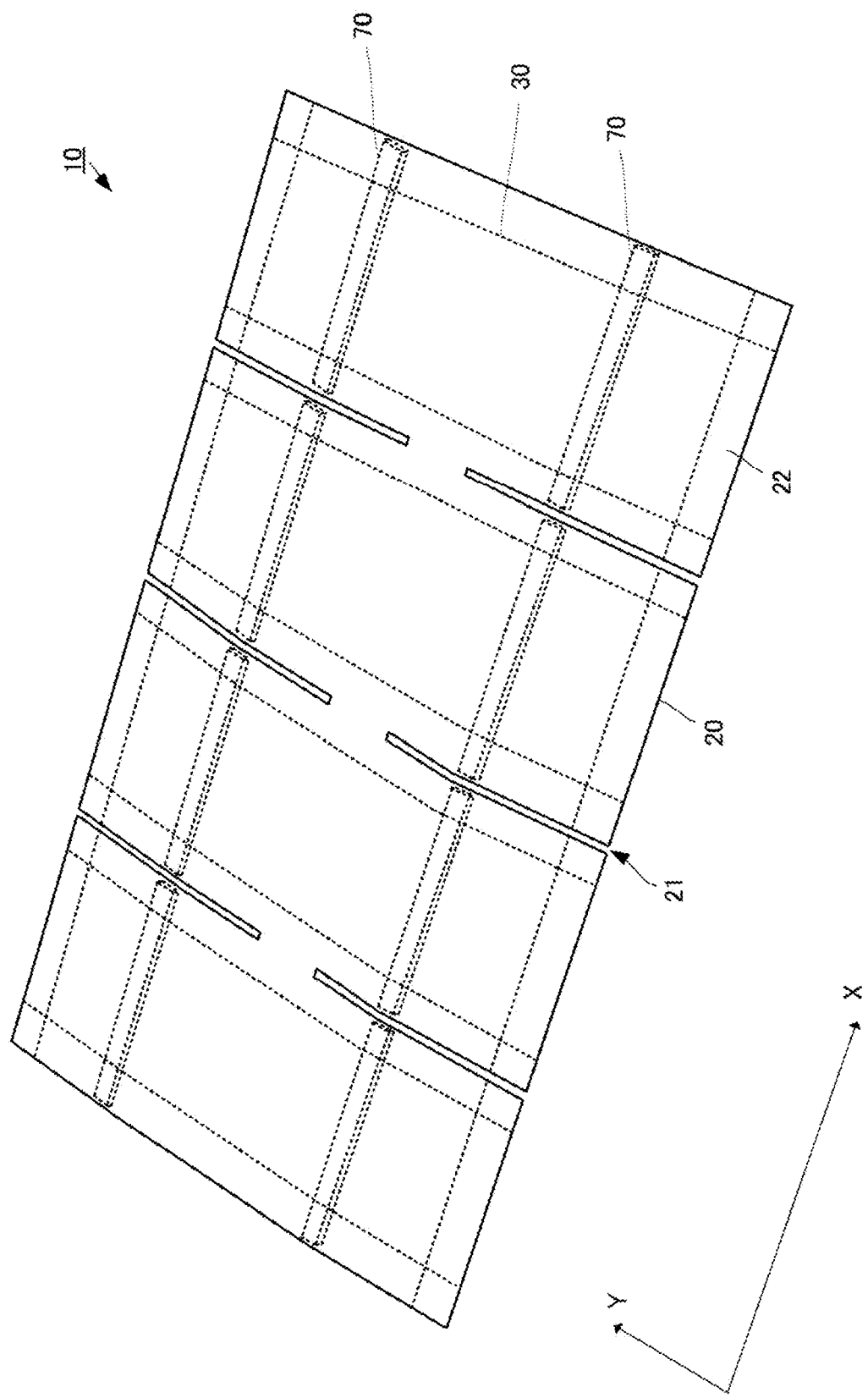
FIG. 1 is an external perspective view of a key input device.
Figure 2:
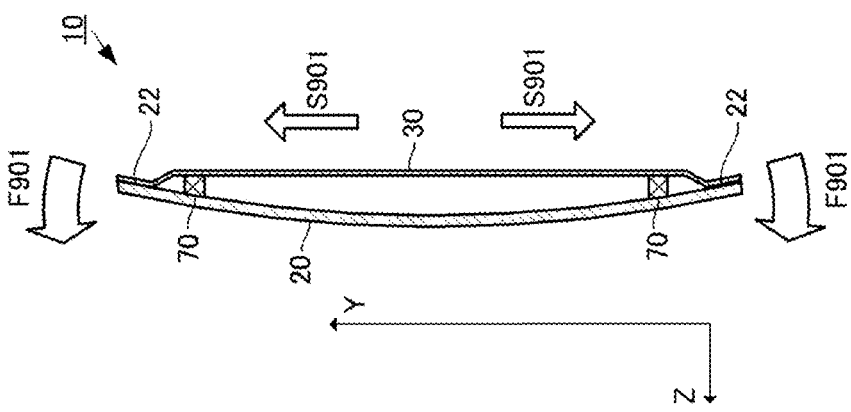
FIG. 2(A) is a front view of the key input device.
FIG. 2(B) is a cross-sectional view taken along line I-I shown in FIG. 2(A).
Figure 2:
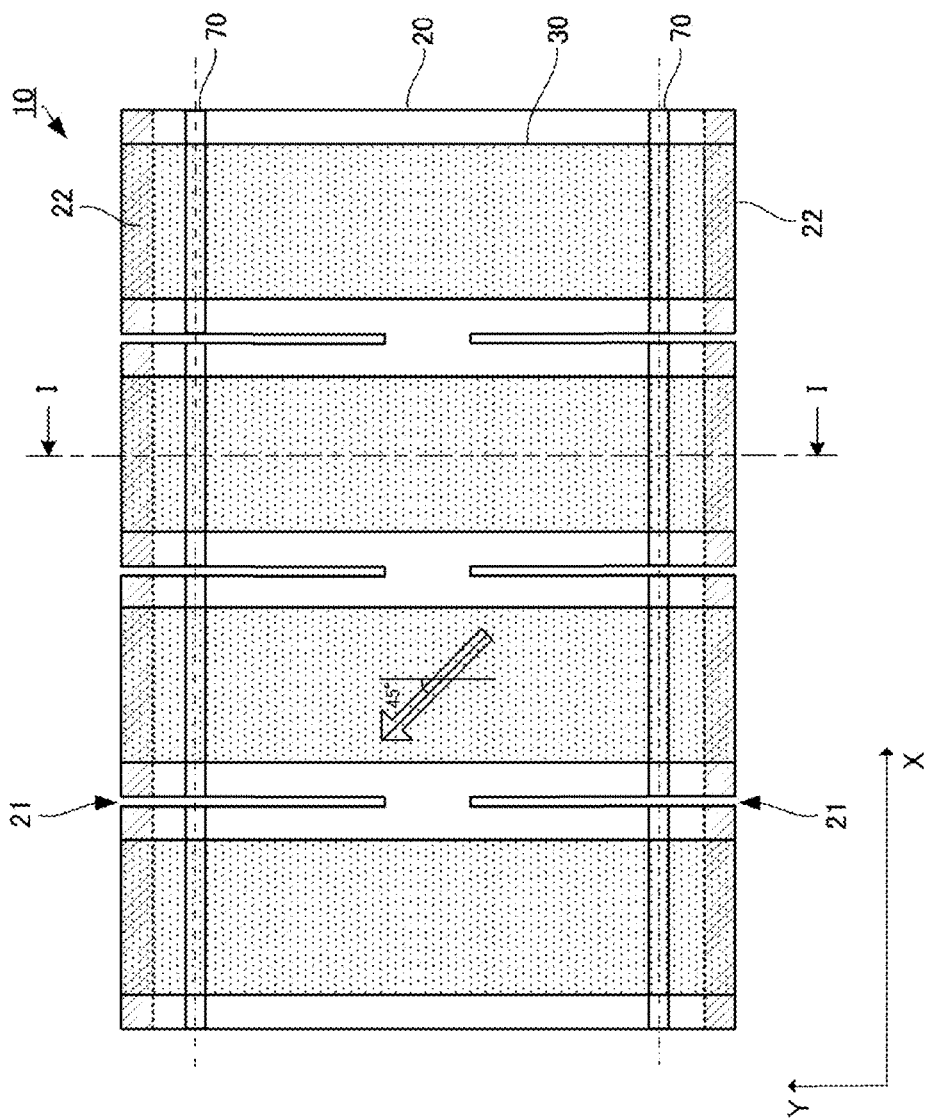

Referring now to the drawings wherein like numerals indicate like elements, a key input device in accordance with an exemplary embodiment of the invention is shown in FIGS. 1 through 4. Referring to FIGS. 1, 2(A) and 2(B), the key input device 10 includes a diaphragm 20, a plurality of piezoelectric films 30, and a spacer 70. The piezoelectric films 30 are arranged at predetermined intervals in an X-axis direction (sometimes referred to herein as the first direction) of the diaphragm 20 to face the diaphragm 20 and extend parallel to a Y-axis direction, orthogonal to the X-axis direction, (sometimes referred to herein as the second direction). Respective ends of the piezoelectric films 30 are fixed to the back surface of respective ends 22 of the diaphragm 20 such that the piezoelectric films 30 are fixed to the diaphragm 20 while extending along the Y-axis direction in a tensioned state (see arrows 5901 in FIG. 2(B)).

Figure 4:
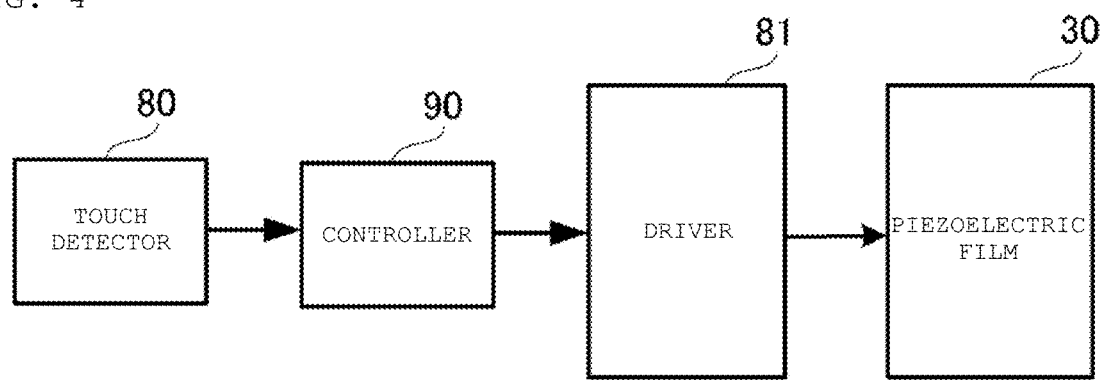
FIG. 4 is a block diagram showing a configuration of the key input device.

Further, as shown in FIG. 4, the key input device 10 includes, as hardware components, a touch detector 80, a controller 90 (preferably one or more programmed microprocessors) connected to the touch detector 80, a driver 81 connected to the controller 90, and the piezoelectric films 30 connected to the driver 81. The key input device 10 is typically a keyboard that is connected to a host device (an information processing device such as a personal computer, not shown) by wire or wirelessly and serves as an interface that receives key inputs made by a user.

The diaphragm 20 preferably has a plate shape and is provided with the touch detector 80 (not shown in FIGS. 2(a) and 2(B))). The touch detector 80 is provided, for example, at positions corresponding to each key in a key layout and detect touch operations made by the user. Note that the touch detector 80 may be of any type as long as it is capable of detecting touch operations made by the user. Exemplary touch detectors are a membrane type, a capacitance type, and a piezoelectric film type.

When the user touches the touch detector 80, the driver 81 applies a drive signal to each of the piezoelectric films 30 causing the piezoelectric film 30 to expand and contract.

As shown in FIGS. 1 and 2(A), the diaphragm 20 has at least one slit 21 formed therein. The slit (or slits) device the diaphragm 20 into respective regions having a rectangular shape in which the X-axis direction is a short side and the Y-axis direction is a long side. The configuration where the diaphragm 20 is divided by the slit 21 allows the piezoelectric films 30 arranged to face the diaphragm 20 having a rectangular shape to have a rectangular shape. That is, the piezoelectric films 30 are each formed in a rectangular shape in which the X-axis direction is a short side and the Y-axis direction is a long side.

The piezoelectric films 30 are strongly influenced by a natural vibration frequency of the Y-axis direction that is the long side. This allows the piezoelectric films 30 extending along the Y-axis direction in a tensioned state to resonate at a vibration frequency that matches the natural vibration frequency. Further, resonance characteristics in the Y-axis direction of the piezoelectric films 30 in the regions are individually adjustable. Therefore, even when the regions are connected to each other with an exterior film or the like, making an adjustment to unify the resonance characteristics in the regions suppresses a decrease in displacement amount.

Further, when a plurality of individual diaphragms are used, a manufacturing process such as alignment or disposition of the diaphragms becomes complicated. On the other hand, the diaphragm 20 according to the present embodiment is divided by the slit 21, which allows the key input device 10 to be configured with a single diaphragm 20. This can eliminate the need for the manufacturing process such as alignment or disposition of the diaphragms. Furthermore, for example, when a glass epoxy resin substrate is used as the diaphragm, wiring can be easily formed on the substrate through patterning. This further allows the driver 81 to apply the drive signal evenly to all the piezoelectric films 30, which makes it possible to cause a plurality of the diaphragms 20 to vibrate at the same magnitude. Furthermore, electrodes including the wiring portion can be formed as one pattern electrode, which allows the driver 81 to apply the drive signal to the plurality of piezoelectric films 30 without loss.

It is preferable that each slit 21 extend parallel to the Y-axis direction from a respective end 22 of the diaphragm 20. This allows each of the slits 21 to be easily formed uniformly, which makes it easy to make the shapes of the respective regions defined by the slits (and the outer periphery of the diaphragm itself) in a uniform shape. Therefore, the resonance characteristics in the Y-axis direction are made uniform, and the resonance frequencies are more easily made equal to each other. This suppresses, even when the regions are connected to each other with an exterior film or the like, a decrease in displacement amount due to a deviation in resonance characteristics among the regions. Note that while it is preferable that the slits 21 be formed parallel to the Y-axis direction and extending from a respective end 22 of the diaphragm 22 in the Y-axis direction, even when the slit 21 is linearly formed at, for example, a gradient of about ±10° with respect to the respective end 22 (i.e., with respect to the linear extending edge of the respective end 22) in the Y-axis direction of the diaphragm 20, the same effect can be exhibited. Further, the slit 21 is not limited to such a linear shape and may be formed in, for example, a stair-like shape.

Further, it is preferable that the slit 21 extend to a point around a center of the diaphragm 20 in the Y-axis direction. In the vicinity of the center in the Y-axis direction of the diaphragm 20, a section that largely vibrates, a so-called loop, is present. The regions are connected to each other at sections that largely vibrate, which similarly causes vibration to be easily transmitted between the portions defined by the slits 21. Accordingly, the resonance frequencies can be more easily made equal to each other, which further suppresses a decrease in displacement amount.

The diaphragm 20 is made of, for example, an acrylic resin PMMA. Note that the diaphragm 20 may be made of a different material such as a metal plate, PET, polycarbonate (PC), fiber reinforced plastic (FRP), or glass. The diaphragm 20 made of one of the above materials has a certain degree of rigidity even when the diaphragm 20 is formed thin, which allows a whole of the diaphragm 20 to evenly bend. This suppresses the displacement amount from becoming non-uniform due to partial bending of the diaphragm 20.

Figure 3:
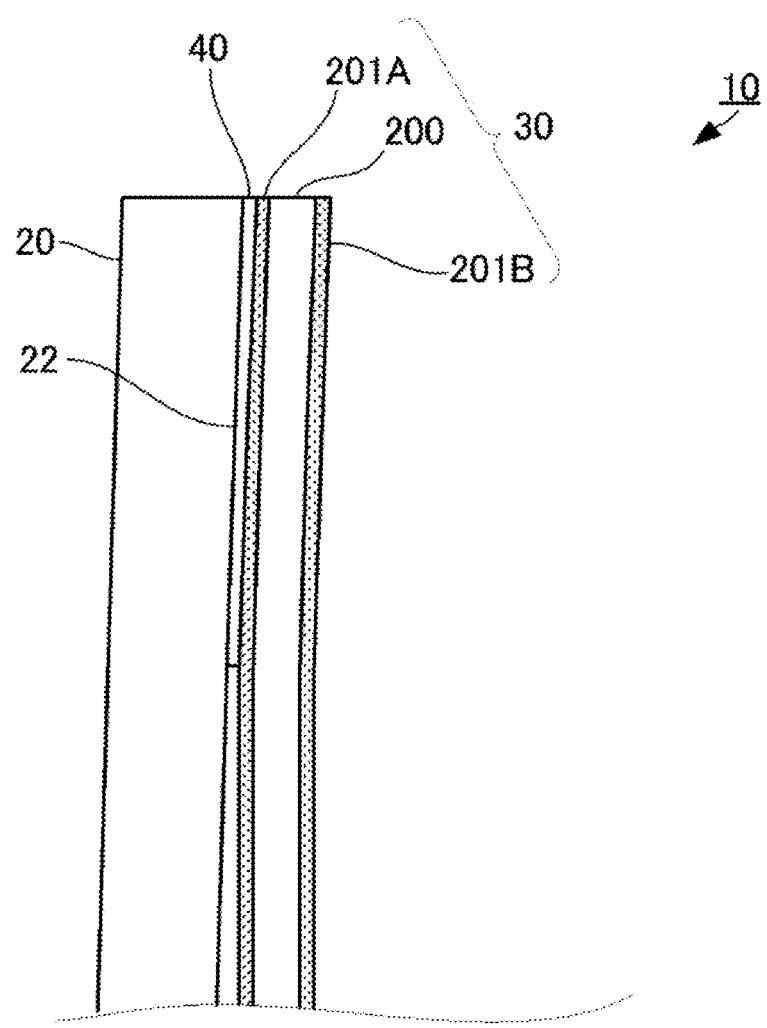
FIG. 3 is a partially enlarged side view of the key input device.

As shown in FIG. 3, each of the piezoelectric films 30 preferably include a base film 200 having a rectangular shape in plan view and electrodes 201A and 201B formed on opposed main surfaces of the base film 200.

The base film 200 is preferably made of a piezoelectric resin such as polyvinylidene fluoride (PVDF) or a chiral polymer. More preferably, the base film 200 is preferably made of PVDF. The base film 200 may alternatively be made of polylactic acid (PLLA) that is highly transparent to light. In a case of using the PLLA, materials that are highly transparent to light are also used for other components, which makes it possible to achieve the key input device 10 that is highly transparent to light almost over an entire surface in front view. Making the base film and the electrodes transparent makes it easy to find a defective product in a state of a finished product. Also, design is enhanced, for example, by shining the keyboard from the inside.

Further, since PLLA has no pyroelectricity, PLLA is not influenced by a change in ambient temperature, and thus, intensity of vibration does not change even when a change in temperature, heat generation in an electronic device, a change in temperature due to contact of a finger, or the like occurs.

When the base film 200 is made of PLLA, as shown in FIG. 2(A), the base film 200 is cut out so that an angle of each outer side is approximately 45° with respect to an extending direction (a direction indicated by an arrow in FIG. 2(A)) to have a rectangular shape.

The electrodes 201A and 201B are preferably formed over both almost the entire are of the main surfaces of the base film 200 and are preferably composed of indium tin oxide (ITO), zinc oxide (ZnO), or polythiophene as a main component. Further, the use of an electrode made of a material with high conductivity such as an aluminum vapor-deposited electrode or a copper foil electrode makes it possible to achieve power saving.

Note that a silver nanowire electrode can be used as the electrodes 201A and 201B, and the aluminum vapor-deposited electrode is preferably used in a use mode where low light transparency is acceptable. The electrodes 201A and 201B are connected with extended wiring (not shown), through which the drive signal is applied to the electrodes 201A and 201B. The electrode 201A disposed adjacent to the diaphragm 20 is attached to the diaphragm 20 with an adhesive layer 40 interposed there between.

As shown in FIGS. 1 and 2(B), the diaphragm 20 is fixed to the piezoelectric films 30 so as to curve and project toward a side (a front side of the diaphragm 20) remote from a side where the piezoelectric films 30 are present (a rear side of the diaphragm 20).

The configuration where the diaphragm 20 projects toward the front side is not an essential requirement for the present invention. The diaphragm 20 may be completely flat. However, it is preferably that the diaphragm 20 does not project toward the rear side with the piezoelectric films 30 connected to the diaphragm 20. That is, a plate surface of the diaphragm 20 is curved when the piezoelectric films 30 are not fixed to the diaphragm 20, and the piezoelectric films 30 may be fixed to the diaphragm 20 such that the plate surface that is curved becomes flat. In this case, since the diaphragm 20 is flat, an operation side of the key input device 10 can be formed flat. This not only facilitates cleaning of the operation side of the key input device 10, but also excels in design. Even when the diaphragm 20 is curved toward the rear side before the piezoelectric films 30 are connected to the diaphragm 20, the diaphragm 20 can take a shape projecting toward the front side with the help of the spacer 70.

In the drawings, the curved state of the diaphragm 20 is exaggerated for the sake of explanation. In reality, the main surface of the diaphragm 20 and the main surface of each of the piezoelectric films 30 are almost parallel to each other and become almost flat in appearance.

In the present embodiment, since the diaphragm 20 is fixed to the piezoelectric films 30 with the plate surface curved, the diaphragm 20 is fixed to the piezoelectric films 30 with bending stress applied to the diaphragm 20 as indicated by arrows F901 in FIG. 2(B). Further, as indicated by arrows 5901 in FIG. 2(B), the piezoelectric films 30 are each brought into a state where tensile force is applied toward short sides of the main surface of the piezoelectric film 30.

When the driver 81 applies the drive signal to each of the piezoelectric films 30 to cause the piezoelectric film 30 to contract along the Y-axis direction, the diaphragm 20 is pulled toward the center from the ends 22 where the diaphragm 20 is fixed to the piezoelectric film 30. This causes the center in the Y-axis direction of the diaphragm 20 to be curved to project forward in the direction of the Z-axis (i.e., to the left as viewed in FIG. 2(B)). Further, the ends 22 in the Y-axis direction of the diaphragm 20 move rearward (i.e., to the right in FIG. 2(B)). Note that sections indicated by dashed lines shown in FIG. 2(A), corresponding to the locations of the spacers 70, each serve as a node of vibration. Even when the piezoelectric film 30 expands and contracts, the diaphragm 20 vibrates very little at the sections serving as the nodes.

On the other hand, when the driver 81 applies the drive signal that is opposite in phase to each of the piezoelectric films 30 to cause the piezoelectric films 30 to expand along the Y-axis direction, the diaphragm 20 is pulled from the center toward the ends 22 where the diaphragm 20 is fixed to the piezoelectric film 30. This brings the center in the Y-axis direction of the diaphragm 20 into a curved state with smaller forward projection. Further, the ends in the Y-axis direction of the diaphragm 20 move forward.

Therefore, the diaphragm 20 vibrates forward and rearward in the Z-axis direction at sections other than the nodes in accordance with an amplitude of the drive signal. This transmits vibration in accordance with the drive signal to the user through the diaphragm 20. Therefore, since the vibration of the diaphragm 20 is fed back to a user's finger through the touch detector 80, the user can feel that the key is "pushed" (i.e., tactile feedback).

Since a steady bending stress is applied to the diaphragm 20 when it is in a non-operating state, a force applied to the diaphragm 20 when the piezoelectric film 30 expands is in the same direction as the bending stress. Therefore, the key input device 10 can efficiently vibrate the diaphragm 20, and even when the piezoelectric film is used, can transmit strong vibration to some extent. Further, compared with a configuration where vibration is generated by a motor or the like, the key input device 10 can be made thinner and more responsive than the configuration with the motor, which makes it possible to reproduce a touch feeling more accurately.

As described above, in the vicinity of the dashed lines shown in FIG. 2(A), the diaphragm 20 has sections serving as nodes that do not vibrate. In the present embodiment, the spacer 70 is disposed, between the diaphragm 20 and the piezoelectric films 30, extending along the X-axis direction of the diaphragm 20. That is, the spacer 70 is disposed for each of the piezoelectric films 30 along the sections serving as the nodes.

The spacer 70 has a function of (a) supporting the diaphragm 20 and (b) generating a tensile force by separating the piezoelectric films 30 from the diaphragm 20. Disposing the spacer 70 along the sections serving as the nodes does not inhibit the vibration of the diaphragm 20 or the expansion and contraction of the piezoelectric films 30. However, while preferred, the spacer 70 is not an essential component in the present invention.

In the present embodiment the key input device 11 includes four piezoelectric films 30. However, fewer or more piezoelectric films can be used. It is preferable that the key input device 11 include at least three piezoelectric films 30. In a configuration where the key input device 11 includes at least three piezoelectric films 30, since the diaphragm 20 has slits 21 that divide the diaphragm 20 into respective regions, the number of the piezoelectric films 30 allocated to each region is preferably two or less. This allows the tension applied to each of the piezoelectric films 30 to be sufficiently maintained. Therefore, it is possible to manufacture the key input device 11 of any size by increasing the number of the piezoelectric films 30.

Figure 5:
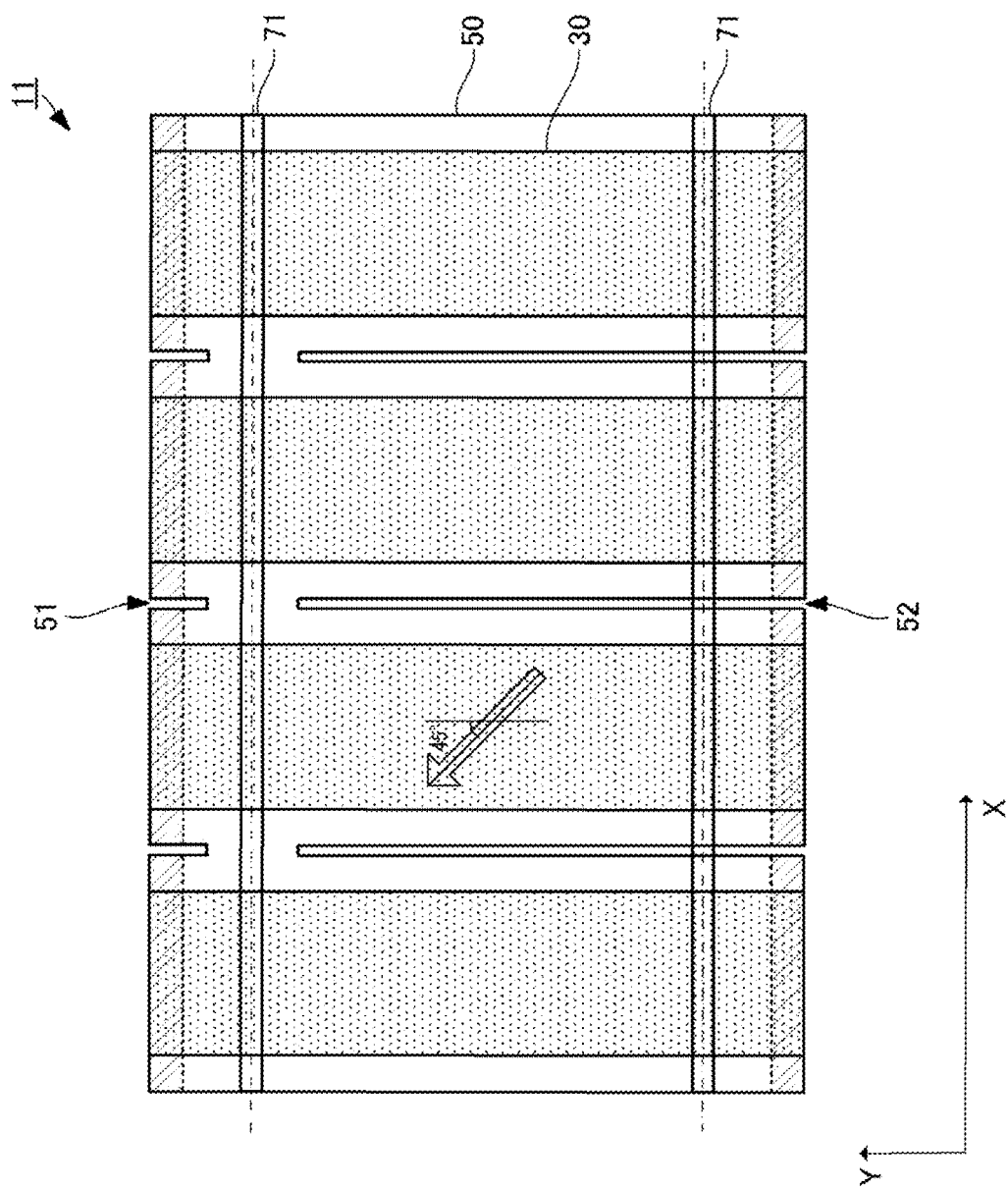
FIG. 5 is a plan view showing a first modification of a diaphragm.

Next, FIG. 5 is a plan view showing a first modification of the diaphragm of the first embodiment. In the above-described embodiment, the slit 21 of the diaphragm 20 is formed up to a point around the center of the diaphragm 20 in the Y-axis direction. In the modified diaphragm 50 shown in FIG. 5, the diaphragm 50 continues along one of nodes of the diaphragm. More specifically, a key input device 11 according to the first modification includes the diaphragm 50 which has a plurality of pairs of slits 51, 52 formed there through. The spacers 71 are disposed along the sections serving as the nodes of the diaphragm 50. The slit 51 is shorter in length in the Y-axis direction than the slit 52. The slit 51 is not formed through any of the sections serving as the nodes of the diaphragm 50. Further, the slit 52 is not formed through the section serving as the node of diaphragm 50 on a side adjacent to where the slit 51 is formed. This causes the diaphragm 50 to continue along the section serving as the node adjacent to where the slit 51 is formed. Therefore, the diaphragm 50 is divided into rectangular regions by the slits 51, 52.

Further, the spacers 71 extend from both ends of the diaphragm 50 in the X-axis direction and are arranged, in the Y-axis direction, along the sections serving as the nodes.

That is, the spacers 71 are fixed to the sections serving as the nodes of the diaphragm 50 while extending across the plurality of piezoelectric films 30. Therefore, at least two spacers 71 will suffice, which makes it possible to simplify the manufacturing process for fixing or the like.

For example, as shown in FIG. 2(A), when the slit is formed such that a portion in the vicinity of the center of the diaphragm continues, it is possible to minimize the variation among vibrating regions. On the other hand, as shown in FIG. 5, the configuration according to the first modification makes it possible to increase the reliability of the wiring portion. In the example shown in FIG. 2(A), the continuous portion becomes a section where the largest vibration is generated, and large vibration is similarly applied to the wiring portion. On the other hand, in the configuration according to the first modification, when wiring is formed along the front surface or the back surface of the diaphragm 50 in wiring the electrodes between the piezoelectric films 30, the wiring is disposed on the continuous portion. As described above, forming the continuous portion near a peripheral portion remote from the vicinity of the center makes it possible to reduce the vibration affecting the wiring and thus increase the reliability.

Figure 6:
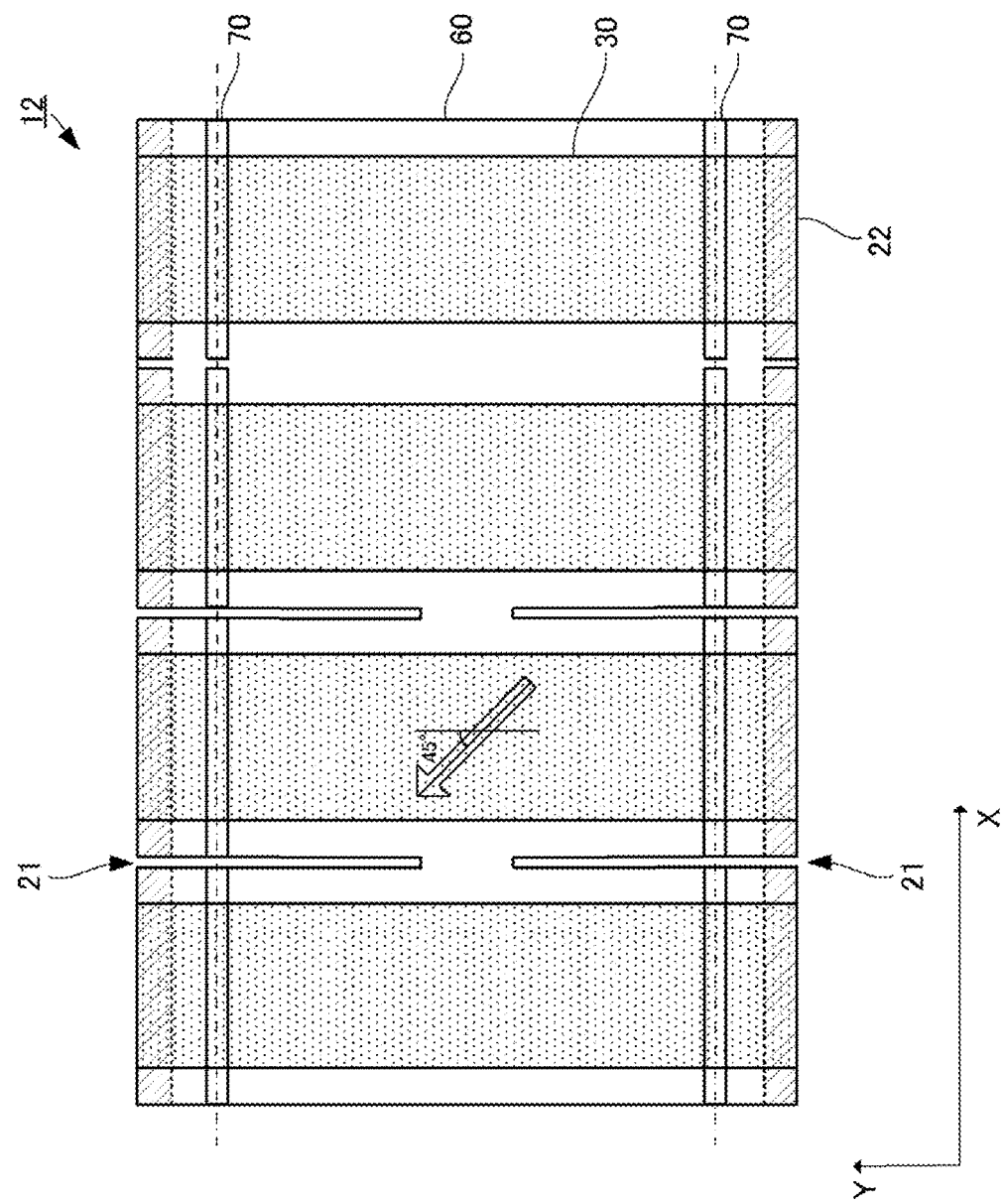
FIG. 6 is a plan view showing a second modification of a piezoelectric film.

FIG. 6 is a plan view showing a second modification of the piezoelectric film. In the first-described embodiment, one piezoelectric film 30 is disposed in the region defined by the slit 21, but in this second modification, one or two piezoelectric films 30 are disposed in a region defined by the slit 21. More specifically, a key input device 12 according to the second modification includes a diaphragm 60 having two pairs of slits 21. Two piezoelectric films 30 on the left side in the X-axis direction of FIG. 6 are disposed in respective adjacent regions defined by the slits 21. On the other hand, two piezoelectric films 30 on the right side in the X-axis direction of FIG. 6 are disposed in a region defined by the slits 21. As described above, it is preferable that the number of the piezoelectric films 30 disposed in the region defined by the slits 21 be two or less. The configuration where two or less piezoelectric films 30 are disposed in the region defined by the slits 21 allows the tension applied to the piezoelectric films 30 to be maintained, which makes it easy to suppress a variation in displacement amount between the piezoelectric films 30.

An example and comparative example will be described below. In the example, a displacement amount during resonance was examined using the key input device of the first-described embodiment. A diaphragm used in the key input device had a length of 230 mm in the X-axis direction and a length of 100 mm in the Y-axis direction. For the sake of convenience, four regions in the diaphragm defined by slits were defined as first to fourth regions. A piezoelectric film having a length of 40 mm in the X-axis direction and a length of 100 mm in the Y-axis direction was used. Table 1 shows resonance frequencies and displacement amounts during resonance measured at respective center positions of the first to fourth regions.

TABLE 1

|  |  | Resonance frequency [Hz] | Displacement amount during resonance [μm] | Average value of displacement amount during resonance [μm] | Average value of displacement amount during resonance with membrane attached [μm] | Rate of decrease in displacement amount during resonance with membrane attached [%] |
| --- | --- | --- | --- | --- | --- | --- |
| Example | First region | 217 | 89.3 | 89.5 | 41.2 | 54 |
|  | Second region | 215 | 89.0 |  |  |  |
|  | Third region | 216 | 89.0 |  |  |  |
|  | Fourth region | 216 | 90.8 |  |  |  |
| Comparative example | First vibrator | 218 | 106.8 | 107.9 | 30.1 | 72 |
|  | Second vibrator | 223 | 119.0 |  |  |  |
|  | Third vibrator | 215 | 97.3 |  |  |  |
|  | Fourth vibrator | 215 | 108.5 |  |  |  |

Further, in the comparative example, vibrators (first to fourth vibrators) each including a diaphragm having a length of 57 mm in the X-axis direction and a length of 100 mm in the Y-axis direction were used. As in the example, the piezoelectric film having a length of 40 mm in the X-axis direction and a length of 100 mm in the Y-axis direction was used. Table 1 shows resonance frequencies and displacement amounts during resonance measured at respective center positions of the first to fourth vibrators. Table 1 further shows respective average values of the displacement amounts during resonance in the example and the comparative example.

It is confirmed from Table 1 that variations in resonance frequency and displacement amount during resonance measured in the first to fourth regions of the example of the present invention are all small. In contrast, it is confirmed that variations in resonance frequency and displacement amount during resonance measured in the first to fourth vibrators of the comparative example are significantly large as compared with the example.

Further, in the example and the comparative example, with the key input device according to the example or each of the first to fourth vibrators according to the comparative example attached to a membrane film having a length of 230 mm in the X-axis direction and a length of 100 mm in the Y-axis direction, displacement amounts during resonance were measured. In the example and the comparative example, Table 1 shows average values of the displacement amounts during resonance with the membrane film attached. Table 1 also shows rates of decrease with the membrane film attached.

From Table 1, in the example, the rate of decrease in displacement amount during resonance with the membrane film attached was 54%. On the other hand, in the comparative example, the rate of decrease in displacement amount during resonance with the membrane film attached was 72%. Accordingly, it is confirmed that, with the membrane film attached, the decrease in displacement amount in the example is suppressed as compared with the comparative example. Therefore, in the example, even when the vibrators are connected to each other via a film switch, an exterior film or the like as a base material, the decrease in displacement amount is suppressed as compared with the comparative example.

Note that the piezoelectric film is an example of a film that deforms in a plane direction when a voltage is applied, but other examples of such a film that deforms in the plane direction when a voltage is applied include an electrostrictive film, an electret film, a composite film, and an electroactive polymer film.

Further, "a film that deforms in the plane direction when a voltage is applied" can also be realized by using a piezoelectric ceramic, a resin film, or the like. For example, such a film can be realized by connecting a plurality of resin films by using a piezoelectric ceramic and connecting the plurality of resin films to the diaphragm 20.

Further, "a film that deforms in the plane direction when a voltage is applied" may be a single-layered film or a multi-layered film. In particular, the larger the number of films to be laminated, the stronger vibration becomes.

Although the key input device has been given as an example of the vibration device in the above example, the vibration device of the present invention is not necessarily limited to such a key input device, and, for example, a gaming machine, or a control panel or speaker of a home appliance is also an example of the vibration device.

The description of each of the above-described embodiments is merely an example in all respects, and should not be considered to be restrictive. The scope of the present invention is defined by the claims rather than the embodiments described above. Furthermore, the scope of the present invention includes the claims and equivalents of the claims.

DESCRIPTION OF REFERENCE SYMBOLS 10, 11, 12: key input device
20, 50, 60: diaphragm
21, 51, 52: slit
30: piezoelectric film
70, 71: spacer
200: base film
201A, 201B: electrode

The invention claimed is:

1. A vibration device comprising:
a diaphragm having at least one slit which extends in a first direction and divides the diaphragm into a plurality of regions, none of the regions of the diaphragm being flat; and
a plurality of piezoelectric films that are arranged at predetermined intervals in a second direction, which is orthogonal to the first direction, so as to face the diaphragm and extend parallel the first direction, the piezoelectric films being fixed to the diaphragm while extending along the first direction in a tensioned state and expanding and contracting in a plane direction when a voltage is applied thereto.

2. The vibration device according to claim 1, wherein no portion of any of the respective regions are flat.

3. The vibration device according to claim 1, further comprising a pair of spacers extending in the second direction and being disposed between the diaphragm and the piezoelectric films.

4. The vibration device according to claim 3, wherein no portion of any of the respective regions are flat in the area between the pair of spacers.

5. The vibration device according to claim 4, wherein the spacers are located at respective nodes of the diaphragm.

6. The vibration device according to claim 1, wherein each of the respective regions has the same cross-sectional shape as viewed along a plane extending parallel to the first and second directions.

7. The vibration device according to claim 1, wherein a respective set of the piezoelectric films are disposed in each region of the diaphragm, each region containing one or two of the piezoelectric films.

8. The vibration device according to claim 1, wherein at least one of the regions has a rectangular shape having a width and a length, the length being longer than the width, the width being parallel to the second direction, the length being parallel to the first direction.

9. The vibration device according to claim 8, wherein all of the respective regions have a rectangular shape having a width and a length, the length being longer than the width, the width being parallel to the second direction, the length being parallel to the first direction.

10. The vibration device according to claim 1, wherein each of the piezoelectric films are located in a respective region of the diaphragm.

11. The vibration device according to claim 1, wherein the plurality of piezoelectric films is three or more piezoelectric films.

12. The vibration device according to claim 1, wherein at least one of the slits extends parallel in the first direction from an edge of the diaphragm.

13. The vibration device according to claim 12, wherein at least one of the slits extends to a location around a center of the diaphragm as measured along the first direction.

14. The vibration device according to claim 1, wherein each of the slits extends in the first direction from a respective edge of the diaphragm.

15. The vibration device according to claim 14, wherein each of the slits extends to a location around the center of the diaphragm as measured along the first direction.

16. The vibration device according to claim 1, wherein the diaphragm has a rectangular shape with two length sides and two width sides, the length sides extending in the second direction and being longer than the width sides and each of the slits extends from a respective one of the length sides.

17. The vibration device according to claim 1, further comprising a spacer disposed between the diaphragm and the piezoelectric films, the spacer extending along the second direction.

* * * * *